United States Patent
Yang et al.

(10) Patent No.: US 9,646,720 B2
(45) Date of Patent: *May 9, 2017

(54) SELF-REPAIR LOGIC FOR STACKED MEMORY ARCHITECTURE

(71) Applicant: Intel Corporation, Santa Clara, CA (US)

(72) Inventors: Joon-Sung Yang, Austin, TX (US); Darshan Kobla, Austin, TX (US); Liwei Ju, Austin, TX (US); David Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/813,010

(22) Filed: Jul. 29, 2015

(65) Prior Publication Data

US 2016/0055922 A1 Feb. 25, 2016

Related U.S. Application Data

(63) Continuation of application No. 13/976,405, filed as application No. PCT/US2011/067283 on Dec. 23, 2011, now Pat. No. 9,136,021.

(51) Int. Cl.
*G11C 7/00* (2006.01)
*G11C 29/00* (2006.01)
(Continued)

(52) U.S. Cl.
CPC ............ *G11C 29/70* (2013.01); *G11C 29/025* (2013.01); *G11C 29/04* (2013.01);
(Continued)

(58) Field of Classification Search
CPC ..... H01L 25/0657; H01L 22/22; G11C 29/04; G11C 29/785; G11C 29/808; G11C 29/4401; G11C 29/846
(Continued)

(56) References Cited

U.S. PATENT DOCUMENTS 4,441,170 A 4/1984 Folmsbee et al.
6,909,645 B2 6/2005 Eilert
(Continued)

FOREIGN PATENT DOCUMENTS

JP H02-171845 7/1990
JP H02-189665 8/1990
(Continued)

OTHER PUBLICATIONS

Notice of Preliminary Rejection mailed Nov. 18, 2015 (+ English translation), in Korean Patent Application No. 10-2014-7026223, 9 pages.
(Continued)

*Primary Examiner* — David Lam
(74) *Attorney, Agent, or Firm* — Blakely, Sokoloff, Taylor & Zafman LLP

(57) ABSTRACT

Self-repair logic for stacked memory architecture. An embodiment of a memory device includes a memory stack having one or more memory die elements, including a first memory die element, and a system element coupled with the memory stack. The first memory die element includes multiple through silicon vias (TSVs), the TSVs including data TSVs and one or more spare TSVs, and self-repair logic to repair operation of a defective TSV of the plurality of data TSVs, the repair of operation of the defective TSV including utilization of the one or more spare TSVs.

28 Claims, 10 Drawing Sheets

(51) Int. Cl.
*G11C 29/02* (2006.01)
*G11C 29/44* (2006.01)
*G11C 29/04* (2006.01)
*H01L 21/66* (2006.01)
*H01L 25/065* (2006.01)
*H01L 23/48* (2006.01)

(52) U.S. Cl.
CPC ........ *G11C 29/4401* (2013.01); *G11C 29/702* (2013.01); *G11C 29/785* (2013.01); *G11C 29/846* (2013.01); *H01L 22/22* (2013.01); *H01L 25/0657* (2013.01); *G11C 2213/71* (2013.01); *H01L 23/481* (2013.01); *H01L 2225/06544* (2013.01); *H01L 2225/06596* (2013.01); *H01L 2924/0002* (2013.01)

(58) Field of Classification Search
USPC .......... 365/200, 201, 189.02, 230.02, 185.09
See application file for complete search history.

(56) References Cited

U.S. PATENT DOCUMENTS

| | | | |
|---|---|---|---|
| 7,073,102 B2* | 7/2006 | Nicolaidis | G11C 29/808 714/42 |
| 7,286,380 B2 | 10/2007 | Hsu et al. | |
| 8,384,417 B2* | 2/2013 | Laisne | H01L 25/0657 326/10 |
| 8,867,086 B2* | 10/2014 | Mima | H04N 1/00978 358/1.13 |
| 8,917,569 B2* | 12/2014 | Choi | G11C 29/025 365/200 |
| 9,136,021 B2* | 9/2015 | Yang | H01L 25/0657 365/200 |
| 2004/0064767 A1 | 4/2004 | Huckaby et al. | |
| 2006/0001176 A1 | 1/2006 | Fukaishi et al. | |
| 2008/0101104 A1 | 5/2008 | Ikeda | |
| 2008/0165599 A1 | 7/2008 | Gorman | |
| 2009/0063896 A1 | 3/2009 | Lastras-Montano et al. | |
| 2009/0096478 A1 | 4/2009 | Keeth | |
| 2009/0102503 A1 | 4/2009 | Saito | |
| 2010/0005376 A1 | 1/2010 | LaBerge et al. | |
| 2010/0060310 A1 | 3/2010 | Laisne et al. | |
| 2010/0064186 A1 | 3/2010 | Houg | |
| 2010/0070696 A1 | 3/2010 | Blankenship | |
| 2010/0110745 A1 | 5/2010 | Jeddeloh et al. | |
| 2011/0121366 A1 | 5/2011 | Or-Bach et al. | |
| 2011/0156034 A1 | 6/2011 | Cui et al. | |
| 2011/0228581 A1 | 9/2011 | Park et al. | |
| 2011/0264858 A1 | 10/2011 | Jeddeloh et al. | |
| 2013/0294184 A1 | 11/2013 | Yang et al. | |

FOREIGN PATENT DOCUMENTS

| | | |
|---|---|---|
| JP | H08-272703 | 10/1996 |
| JP | 2011-527064 | 10/2011 |
| TW | 201025543 | 7/2010 |
| WO | WO-2007032184 | 3/2007 |
| WO | WO-2008/076790 | 6/2008 |
| WO | WO-2010/002561 | 1/2010 |

OTHER PUBLICATIONS

Notice of Allowance in Korean Application No. 10-2014-7026223 mailed May 24, 2016, 3 pages.
Office Action and Search Report (+ English Translation) for Taiwanese Application No. 104130128 mailed Jul. 22, 2016, 25 pages.
Notice of Reasons for Rejection (+ English Translation) Japanese Application No. 2014-548772 mailed on Mar. 29, 2016, 5 pages.
Office Action (+ English Translation) in German Application No. 112011106030.0 mailed Mar. 22, 2016, 8 pages.
International Search Report and Written Opinion of the International Searching Authority dated Aug. 30, 2012, in International Patent Application No. PCT/US2011/067283, 8 pages.
International Search Report and Written Opinion of the International Searching Authority dated Nov. 14, 2012, in International Patent Application No. PCT/US2012/031422, 7 pages.
Notice of Allowance mailed Mar. 26, 2015, in U.S. Appl. No. 13/976,409, 8 pages.
Notice of Reasons for Rejection dated Jul. 14, 2015 (+ English translation), in Japanese Patent Application No. 2014-548772, 3 pages.
Office Action mailed Dec. 2, 2014, in U.S. Appl. No. 13/976,409, 19 pages.
Office Action mailed Jan. 15, 2015, in U.S. Appl. No. 13/976,405, 11 pages.
Office Action mailed Mar. 26, 2015 (+ English translation), in Taiwan Patent Application No. 101147199, 13 pages.
Official Letter dated Feb. 11, 2015 (+ English translation), in Taiwan Patent Application No. 102109643, 21 pages.
Youngjoon Choi et al., "Future Evolution of Memory Subsystem in Mobile Applications," Memory Workshop (IMW), 2010 IEEE International, 2 pages.
First Office Action (+ English Translation) for Chinese Application No. 201180075840.9, mailed Feb. 3, 2016, 10 pages.
Second Office Action (+English Translation) for Chinese Application No. 201180075840.9 mailed on Nov. 16, 2016, 16 pages.
Notice of Allowance for Japanese Application No. 2014-548772 mailed Dec. 27, 2016, 1 page.

* cited by examiner

SELF-REPAIR LOGIC FOR STACKED MEMORY ARCHITECTURE

CROSS-REFERENCE TO RELATED APPLICATIONS

This application is a continuation of U.S. patent application Ser. No. 13/976,405, filed Jun. 26, 2013, now U.S. Pat. No. 9,136,021; which is a U.S. national phase of International Patent Application No. PCT/US2011/067283, filed Dec. 23, 2011, which applications are incorporated herein by reference in their entireties.

TECHNICAL FIELD

Embodiments of the invention generally relate to the field of electronic devices and, more particularly, to self-repair logic for stacked memory architecture.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

However, there may a significant cost in the manufacture of 3D stacked memory, in comparison with the cost of simpler memory elements. In the construction of stacked memory devices, a memory die that is without flaws when fabricated may develop flaws in the manufacture of the 3D stacked memory package. Because of this, the cost of defective memory devices may be significant for device manufacturers, or for customers who purchase electronic devices.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
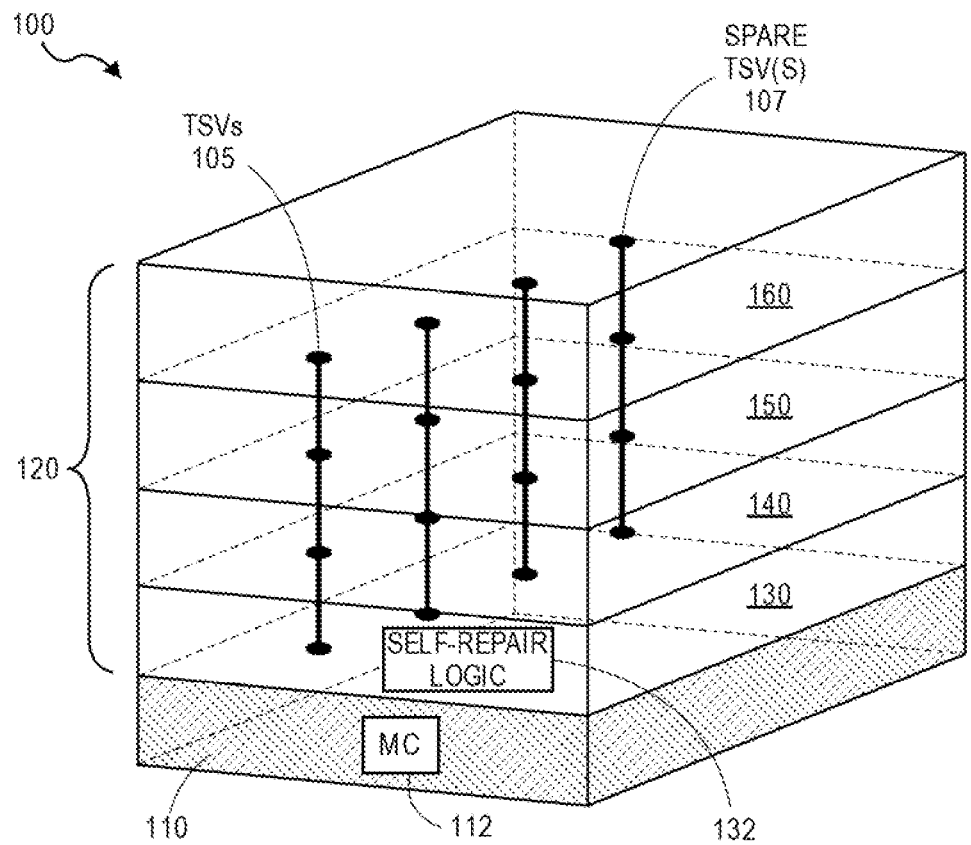
FIG. 1 illustrates an embodiment of a 3D stacked memory.

Embodiments of the invention are generally directed to self-repair logic for a stacked memory architecture.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

With the advent of the stacked DRAM standard (such as the WideIO standard), the DRAM wafer may be stacked with a system element such as a system on chip (SoC) wafer in the same package with a memory stack. The stacked memory may utilize through silicon via (TSV) manufacturing techniques, where vias are produced through silicon dies to provide signal paths through the memory stack.

TSV manufacturing technique is used to interconnect the stacked silicon chips through direct contact. However, this technique may create a significant yield loss when TSVs are defective. The stacked memory assembling process and TSV manufacturing may potentially introduce defects into stacked memory devices. This may result in an increase in manufacturing and test cost increase, and may create yield problem in manufacturing. Defective TSVs are a critical element in stacked memory manufacturing because the existence of defective TSVs will directly impact manufacturing yield. If each device having defective TSVs is discarded, the resulting cost would be significantly greater in comparison with defects in conventional single die memory because in a stacked memory both a stacked DRAM package and an SoC will be lost. In conventional memory, a repair process may include replacement of an entire row or column by extra row or column, but this does not assist in circumstances in which connecting TSVs are defective.

In some embodiments, an apparatus, system, or method includes self-repair logic utilizing spare TSVs to dynamically perform a repair process for defective TSVs. In some embodiments, in order to improve reliability, reduce costs, and increase manufacturing yield, spare TSVs are included among TSVs in a stacked memory device to allow for repairing the defective TSVs. However, repair logic in a stacked memory should be minimized or reduced to avoid excessive hardware overhead for stacked memory devices.

In some embodiments, self-repair logic, such as error correcting code (ECC) and redirection of data, may be adopted for repair of defective TSVs operation using spare TSVs. In some embodiments, a TSV repair technique enables the dynamic repair of defective TSV by replacing the operation of defective TSVs, thus enhance the manufacturing yield and reliability of devices by allowing full operation of stacked memory devices having TSV defects. In some embodiments, a self-repair technique does not require re-routing of devices or shifting operations to different elements to replace defective TSVs.

In some embodiments, the testing to identify defective TSVs and the self-repair of the operation of defective TSVs may occur at various times, and may occur multiple times in the lifespan of a memory device. Testing and self-repair may be either static in initial testing, or dynamic in operation. For example, testing and self-repair of TSV operation may occur in the manufacturing of stacked memory devices, and may occur in the manufacture of an apparatus or system including stacked memory. Further, testing and self-repair may occur in the operation of such apparatus or system. In an example, testing and self-repair may occur at each power up cycle for the apparatus or system.

In some embodiments, an apparatus, system, or method provides for error correction of data transferred by the TSVs of a memory device. In some embodiments, a stacked memory device includes self-repair logic utilizing error correcting code. In this approach, on a transmitting side, a check bit (or other error correcting code) is generated based on data to be transferred by a plurality of TSVs. For example, every data byte may be utilized in the generation of check bits. The data is transferred via the TSVs, with the check bits being transferred via spare TSVs.

On a receiving side, decodes the data (the raw data and the check bit(s)) and corrects the corrupted data, such that correct data is provided by the stacked memory device regardless of the defective TSV channel. Thus, even though there is a defective TSV, the error correcting logic corrects the corrupted data from the channels and thus provides for replacement of the TSV operation.

In certain implementations, certain errors may be detected and corrected, or certain errors may be detected if not corrected, such as in circumstances in which there are excessive numbers of defective TSVs. For example, logic may provide for single error correction and double-error detection (SEC-DED), single-error-correction and double adjacent error correction (SEC-DAEC), and other correction and detection operations. In one example, SEC-DAEC may be particularly useful in TSV operation because defects in a device may cause issues for adjacent TSVs, and thus there may be particular value in correcting double adjacent errors.

Multiple different kinds of self-repair logic may be utilized in an embodiment of an apparatus, system, or method, with error correcting codes and error detecting codes being common examples. For example, for single-bit error correcting code, check bits are generated using the data word. If the size of the data word is D and the number of required check bits to have SEC-DEC capability is C, then C is determined when D and C meet the requirements of Equation 1:

$$2^c \geq D+C+1 \qquad [1]$$

Hence, if the data words are 32 bits, 64 bits, and 128 bits, then, 6, 7, and 8 bits of check bits are required to perform single error correction, respectively. Every 32 TSVs, 64 TSVs, or 128 TSVs may thus have 6, 7, or 8 spare TSVs to perform the repair process using error correcting code.

In some embodiments, an apparatus, system, or method utilizes the redirection of data from a defective TSV to a spare TSV to provide for repair to TSV operation. In some embodiments, a hardware mapping process maps a defective TSV channel to a spare channel to perform the self-repair process. In this approach, on the transmitting side a mapping multiplexer may be used, where selection bits for the multiplexer may be dynamically or statically generated. In some embodiments, on the receiving side de-multiplexing logic is implemented and selection bits may be generated in the same manner. In a dynamic approach, Built-in Self Test (BIST) logic may be run to identify one or more defective TSVs. In some embodiments, static and dynamic repair is performed by utilizing hardware mapping logic in the transmitting side and the receiving side. In some embodiments, the static and dynamic repair processes use multiplexer/de-multiplexer logic or other similar logic to route a defective TSV to a spare TSV.

In some embodiments, a memory device includes a memory stack having one or more memory die elements, including a first memory die element, and a system element coupled with the memory stack. The first memory die element includes multiple TSVs, the TSVs including data TSVs and one or more spare TSVs, and self-repair logic to repair operation of a defective TSV of the plurality of data TSVs, the repair of operation of the defective TSV including utilization of the one or more spare TSVs.

In some embodiments, a method includes conducting a test of a stacked memory device, the stacked memory stack including one or more memory die elements, a system element coupled with the memory stack, and a plurality of TSVs; detecting one or more defective TSVs of the plurality of TSVs; and repairing operation of the one or more defective TSVs, the repair of operation including utilization of the one or more spare TSVs.

In some embodiments, a system includes a processor to process data of the system; a transmitter, receiver, or both coupled with an omnidirectional antenna to transmit data, receive data, or both; and a memory to store data, the memory including a stacked memory device. In some embodiments, the stacked memory device includes a memory stack having one or more memory die elements, including a first memory die element, and a system element coupled with the memory stack, wherein the first memory die element includes a plurality of TSVs, the plurality of TSVs including a plurality of data TSVs and one or more spare TSVs, and self-repair logic to repair operation of a defective TSV of the plurality of data TSVs, the repair including utilization of the one or more spare TSVs.

FIG. 1 illustrates an embodiment of a 3D stacked memory. In this illustration, a 3D stacked memory device 100, such as a WideIO memory device, includes a system element 110 coupled with one or more DRAM memory die layers 120, also referred to herein as the memory stack. In some embodiments, the system element may be a system on chip (SoC) or other similar element. In this illustration, the DRAM memory die layers include four memory die layers, these layers being a first memory die layer 130, a second memory die layer 140, a third memory die layer 150, and a fourth memory die layer 160. However, embodiments are not limited to any particular number of memory die layers in the memory stack 120, and may include a greater or smaller number of memory die layers. Each die layer may include one or more slices or portions, and may have one or more different channels. Each die layer may include a temperature compensated self-refresh (TCSR) circuit to address thermal issues, where the TCSR and a mode register (MR) may be a part of management logic of the device, and where the MC may include thermal offset bit(s) for adjustment of refresh rate by the TCSR. The die layers and the system element may be thermally coupled together.

Among other elements, the system element 110 may include a memory controller 112, such as a WideIO memory controller, for the memory stack 120. In some embodiments, each memory die layer (with the possible exception of the top (or outermost) memory die layer, such as the fourth memory die layer 160 in this illustration) includes a plurality of through silicon vias (TSVs) 105 to provide paths through the memory die layers, as well as one or more spare TSVs 107.

In some embodiments, the stacked memory device 100 provides for self-repair of TSV operations utilizing the spare TSVs 107. In some embodiments, one or more of the memory die layers 120 includes detection logic (such as detection 132 illustrated in the first memory die layer 130) to detect defective TSVs. The detection logic 132 may include BIST elements of the memory die layer. In some embodiments, one or more of the memory die layers 120 includes spare TSV self-repair logic (such as the self-repair logic 132 illustrated in the first memory die layer 130) to provide for repair of the TSV operation for defective TSVs. In some embodiments, the self-repair logic 132 may include error correction logic utilizing the spare TSVs, where the error correction logic corrects errors generated by one or more defective TSVs. In some embodiments, the spare TSV logic may include multiplexing and de-multiplexing operations to allow for the rerouting of data of defective TSVs through spare TSVs.

Figure 2:
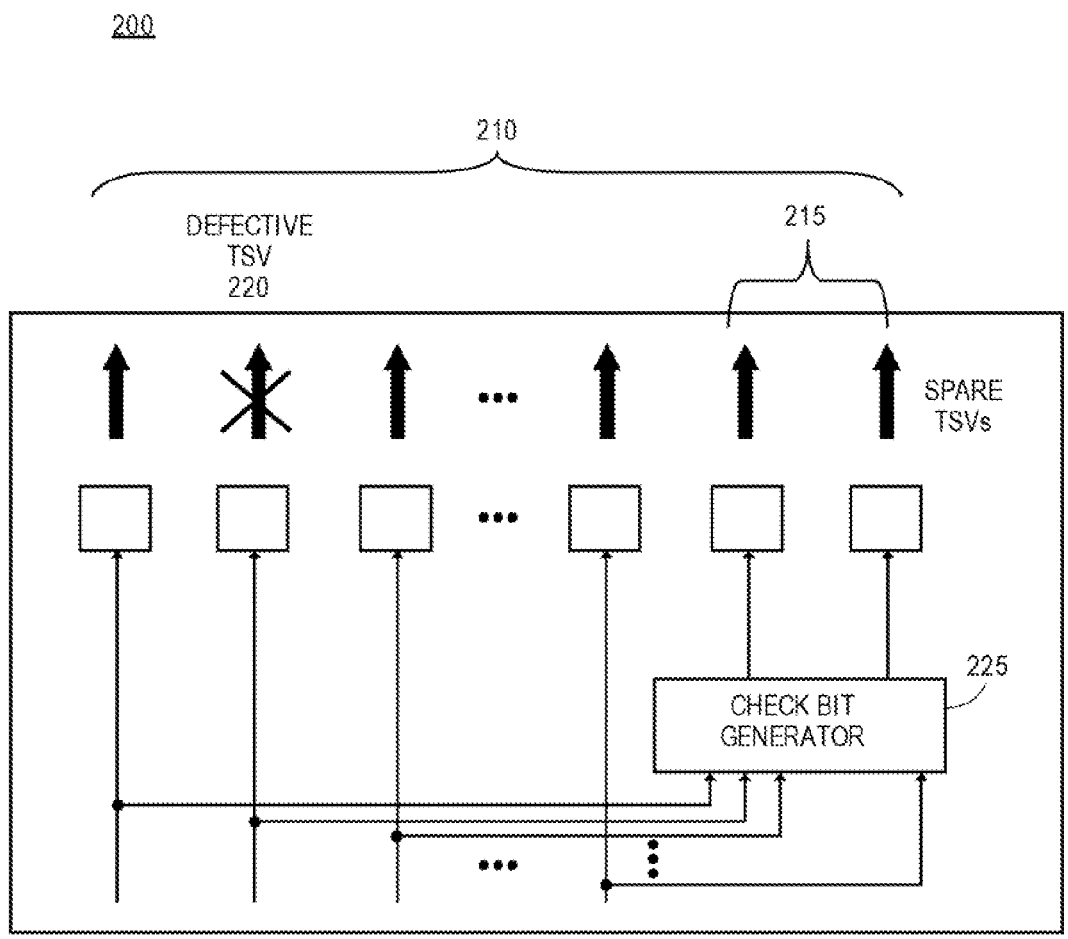
FIG. 2 illustrates an embodiment of a self-repair apparatus or system that provides for replacement of defective TSV operation using generation of error correction code.

FIG. 2 illustrates an embodiment of a self-repair apparatus or system that provides for replacement of defective TSV operation using generation of error correction code. FIG. 2 illustrates an embodiment of hardware architecture to generate check bits based on a received data word. However, embodiments are not limited to any particular error correction structure. In some embodiments, regardless of the location of defective TSV, corrupted data may be restored by the ECC scheme.

In this illustration, a memory apparatus or system 200 includes a plurality of TSVs 210, where the plurality of TSVs includes one or more spare TSVs 215. The non-spare TSVs intended to receive data may be referred to herein as data TSVs. As illustrated, at some point in time, a TSV 220 has become defective. As illustrated, inputs to the data TSVs of the plurality of TSVs 210 are also connected to a check bit generator 225 (or other error correction code generator, including error correction code generator 300 in FIG. 3). In some embodiments, the check bit generator 225 generates check bits for transmission via the spare TSVs 215, where the check bits are used in the correction of data that has been corrupted by the defective TSV 220.

Figure 3:
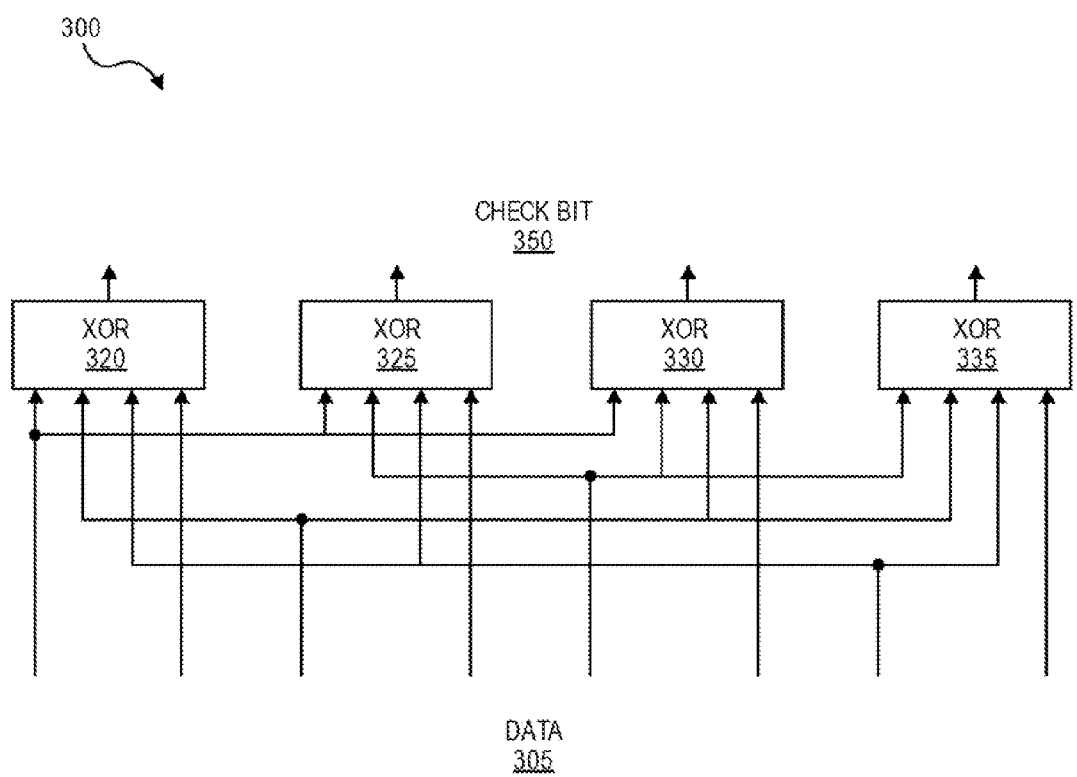
FIG. 3 is an illustration of the generation of error correction code in an embodiment of an apparatus or system.

FIG. 3 is an illustration of the generation of error correction code in an embodiment of an apparatus or system. In some embodiments, a error correction code generator 300 (such as check bit generator 225 illustrated in FIG. 2) receives each data bit input 305 intended for a plurality of TSVs (such as the data TSVs of the plurality of TSVs 210 illustrated in FIG. 2).

In this particular implementation, the error correction code generator 300 includes a plurality of exclusive OR elements (XOR 320, 325, 330, and 335) to generate check bits 350 for use in the self-repair process for TSVs. However, embodiments of a memory apparatus or system are not limited to any particular error correction code generator implementation.

Figure 4:
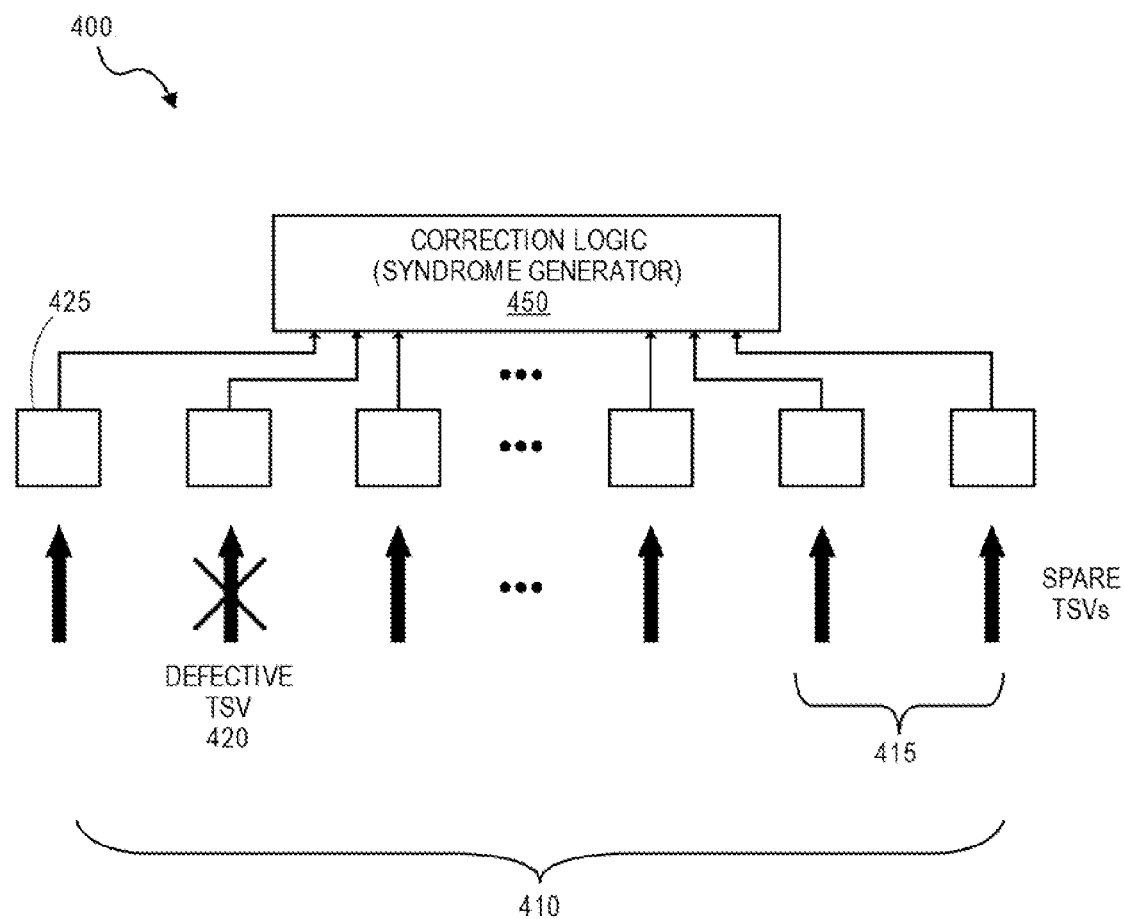
FIG. 4 illustrates an embodiment of error correction elements for a apparatus or system providing self-repair of defective TSV operation.

FIG. 4 illustrates an embodiment of error correction elements for a apparatus or system providing self-repair of defective TSV operation. In some embodiments, a memory apparatus or system 400 includes error correction logic 450 to provide for self-repair of defective TSV operation. In some embodiments, the correction logic will receive data from a plurality of TSVs 410 coupled to connections 425, where the TSVs include spare TSVs 415, the spare TSVs being utilized to provide generated error correction code based on the data transmitted via the non-spare TSVs.

In this example, the TSVs include one or more defective TSVs, such as a defective TSV 420. In some embodiments, the memory apparatus or system utilizes the error correction logic to provide self-repair of the operation of the defective TSV 420 by generating corrections for errors caused by the defective TSV.

Figure 5:
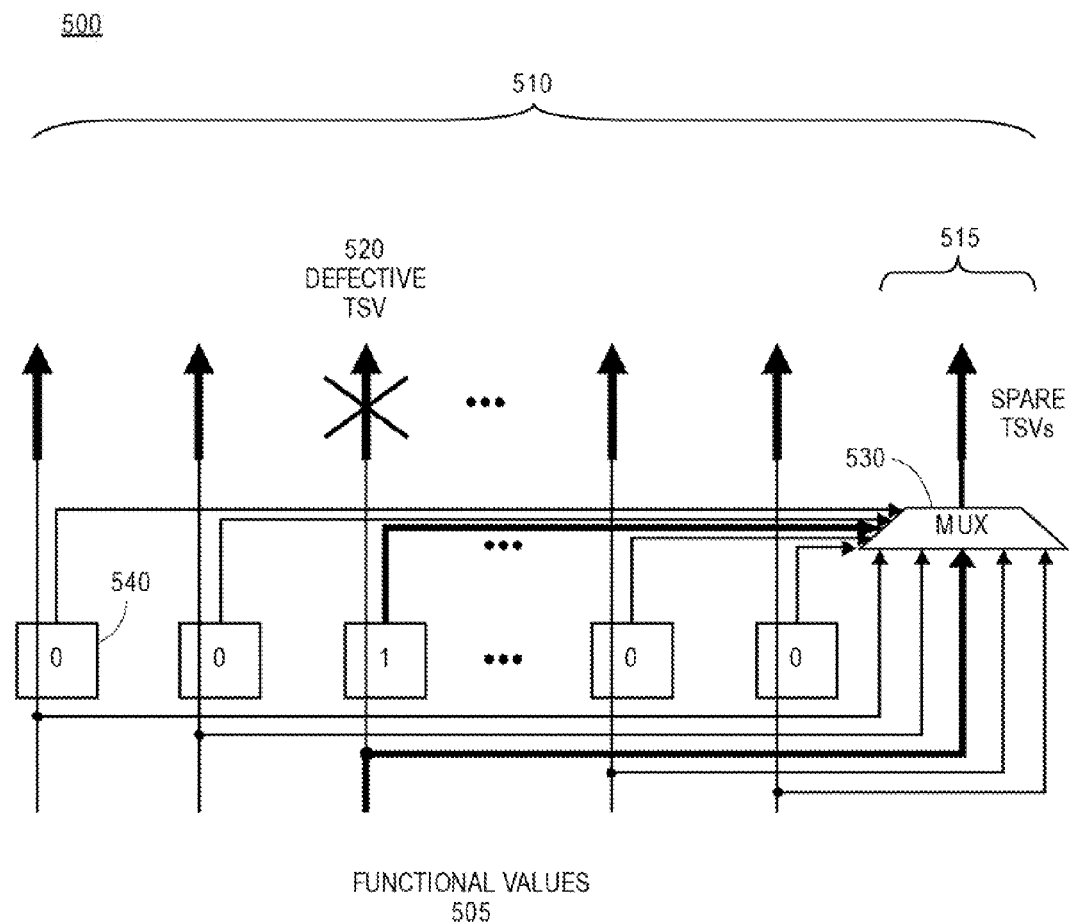
FIG. 5 is an illustration of an apparatus or system providing for self-repair of TSV operation using substitution of defective TSVs with spare TSVs.

FIG. 5 is an illustration of an apparatus or system providing for self-repair of TSV operation using substitution of defective TSVs with spare TSVs. In some embodiments, a hardware mapping process, which may be utilized in static and dynamic repairs, utilize multiplexer/de-multiplexer logic to route data intended for a defective TSV to a spare TSV.

In some embodiments, a memory apparatus or system 500 receives a plurality of functional values 505 that are intended for a set of TSVs 510, where the TSVs of the apparatus or system 500 also include one or more spare TSVs 515. In some embodiments, the apparatus or system includes a multiplexer 530, where the multiplexer is used to choose a data line for which there is a defective TSV such that the data for the defective TSV is routed to a spare TSV. In some embodiments, the transmission of the data via the spare TSV allows for self-repair of the operation of the defective TSV in transmission of the relevant data.

FIG. 5 illustrates a particular implementation is which a multiplexer element is used to re-route data to a spare channel. However, embodiments are not limited to this particular implementation, and may utilize any elements that provide for the selection of the data of a defective TSV for transmission using a spare TSV. For example, the multiplexer logic may be implemented using standard cell, pass transistor, or primitive logic gates. If a pass transistor logic implementation is chosen in an embodiment, then the pass transistor logic may be added to all channels of the memory device for delay balancing.

In a particular example, if the third TSV of a plurality of TSVs is determined to be defective (such as shown in FIG. 5), a defect location may be identified by fusing for a static operation, where a fuse 540 is illustrated for each transmission TSV. The fusing is represented in FIG. 5 as '1' or '0' (where '1' indicates a defect location and '0' indicates a location having no defect). In this implementation, defect location bits are used as mux/demux selection bits. However, embodiments are not limited to this particular implementation of the selection data for the multiplexer and de-multiplexer operations.

Figure 6:
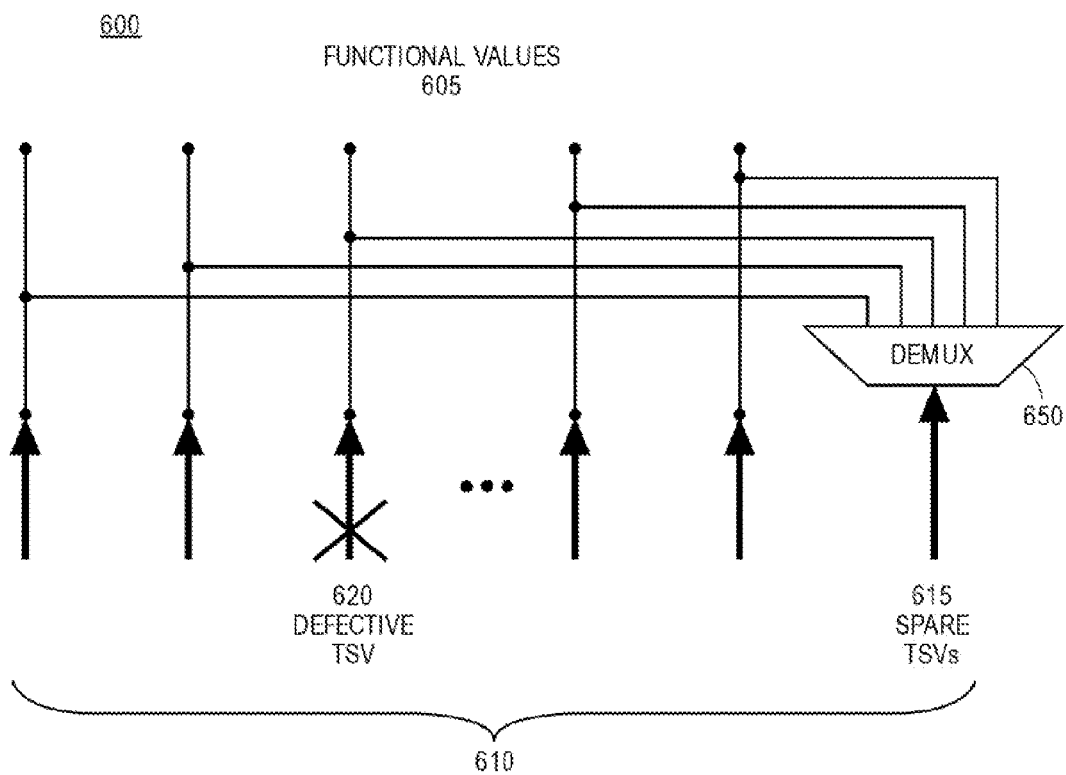
FIG. 6 is an illustration of an embodiment of an apparatus or system providing for use of data of spare TSVs to substitute for data from defective TSVs.

FIG. 6 is an illustration of an embodiment of an apparatus or system providing for use of data of spare TSVs to substitute for data from defective TSVs. In some embodiments, a memory apparatus or system 600 includes a plurality of TSVs 610 to transfer functional values 605, where the TSVs include one or more spare TSVs 615 for use in the self-repair of defective TSV operation. In this illustration, TSV 620 is defective, and as a result the data intended for such TSV has instead been transmitted via a substitute TSV of the one or more spare TSVs 615. In some embodiments, the apparatus or system 600 includes a demultiplexer 650 for use in directing the data received from the spare TSVs 615 to the correct location for the defective TSV 620. While not included in this illustration, the selection of for the demultiplexer may include fusing as illustrated in FIG. 5.

Figure 7:
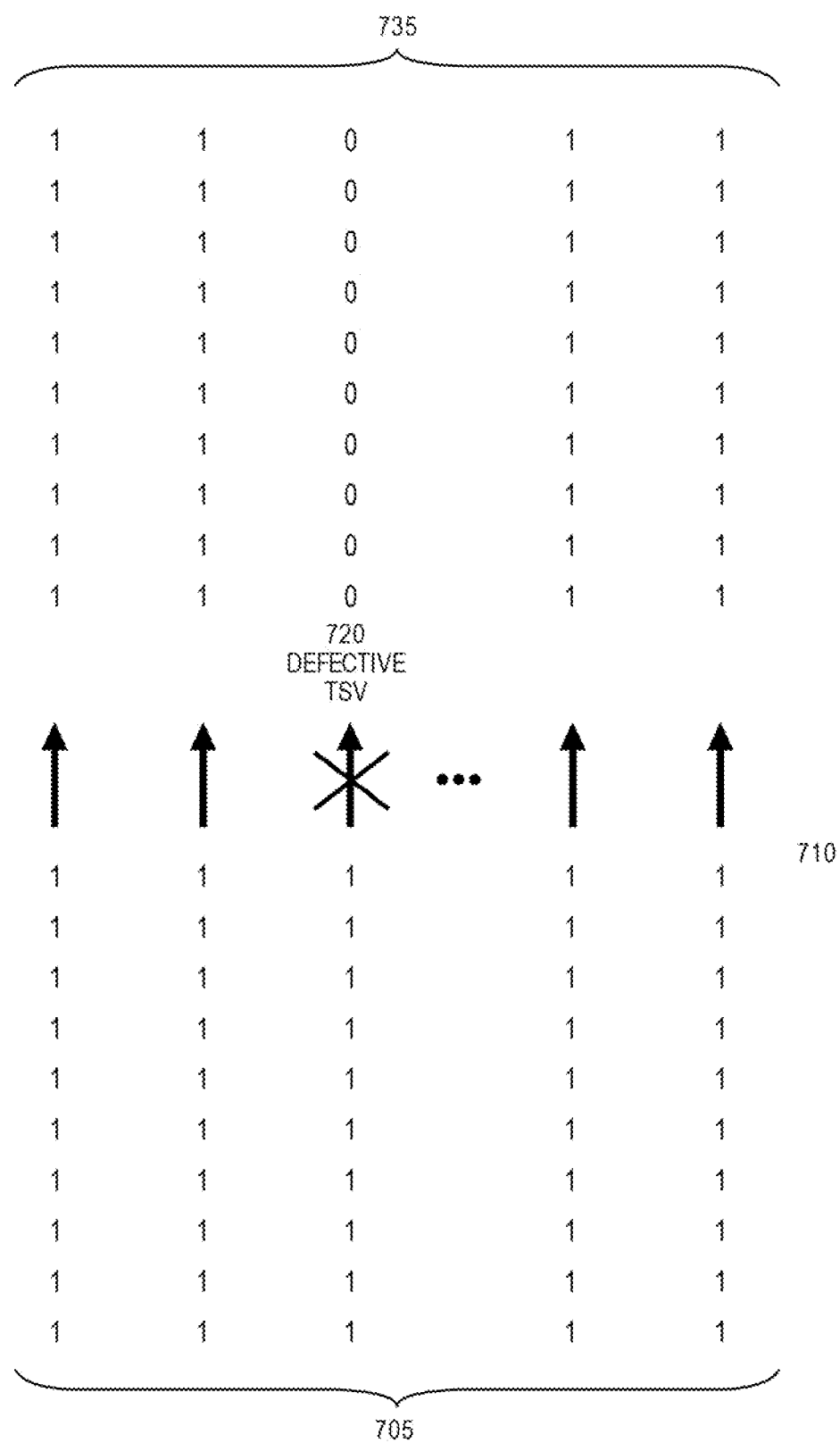
FIG. 7 is an illustration of an embodiment of identification of defective TSVs in a device or system.

FIG. 7 is an illustration of identification of defective TSVs in a device or system. In this illustration, a plurality of TSVs 710 may include one or more defective 720 TSVs. At a point in time, a test of the TSVs may occur, where the testing may include the use of BIST circuitry in the memory die elements of the apparatus of system. In this illustration, a test sequence may include the input of various inputs 705, including all '1'. In this illustration, the defective TSV 720 provides an erroneous '0' value in outputs 735. In some embodiments, the apparatus or system operates to identify the TSV 720 as defective, and to utilize such information to provide for self-repair of the operation of the TSV.

In some embodiments, for dynamic repair a BIST engine may be run as a part of the initial firmware bring up/Reset sequence. In some embodiments, hardware may be implemented to detect the failing channel dynamically. For example, the hardware implementation may include a counter to keep track of a number of read mismatches, and a comparator is implemented to compare expected number of reads with total read mismatches. If the number of mismatches equals the expected number, then the failing TSV channel can be identified. As an example, a DRAM may have four entries with each entry having a width of 32. In this example, the BIST engine writes all 1's to each entry and reads each entry of the 4 entries back. If read mismatch=4 and if all the mismatches are indicated to the same failing bit (say data bit 25), then the TSV channel corresponding to data bit 25 is the failing and needs to be replaced. In some embodiments, once the failing channel location is identified, mux/demux select bits may be programmed in one of multiple different ways such as firmware, uCode, or any other data bit programming method.

Figure 8:
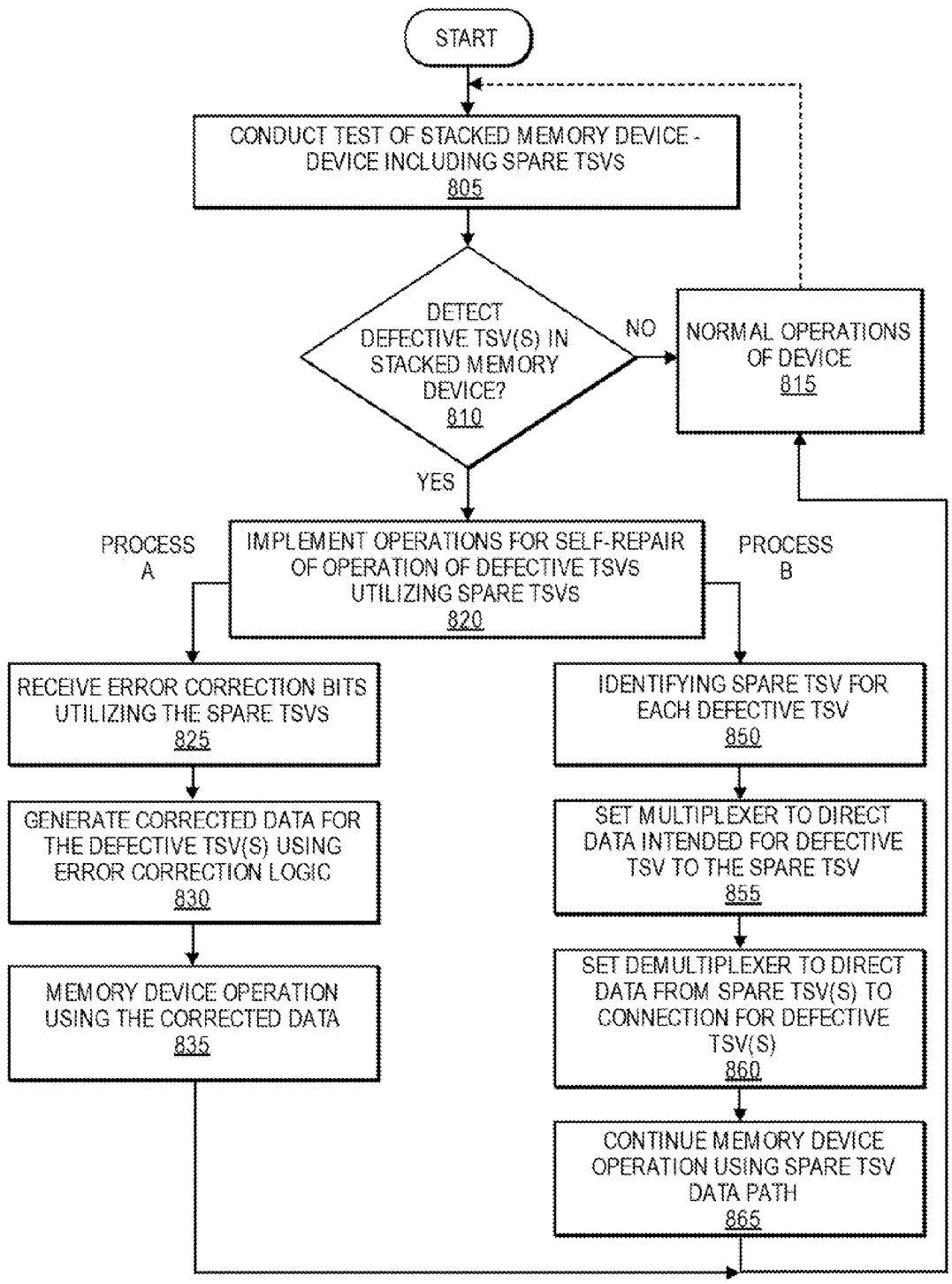
FIG. 8 is a flowchart to illustrate an embodiment of a process for using spare TSVs in a stacked memory device to repair operations of defective TSVs.

FIG. 8 is a flowchart to illustrate an embodiment of a process for using spare TSVs in a stacked memory device to repair operations of defective TSVs. In this illustration, testing may be conducted for a stacked memory device 805, where the stacked memory device includes spare TSVs and logic to provide for self-repair of defective TSV operation. In some embodiments, there may be testing to determine whether one or more defective TSVs have been identified in the stacked memory device 810. If no defective TSVs have been identified, normal operation may be commenced or continued 815, which, depending on the implementation, may be followed by period retesting of the memory device 805, such as testing on start up of the apparatus or system containing the memory device.

In some embodiments, the testing of TSVs may vary depending on the self-repair implementation. In some embodiments, the testing may include the generation of error correction bits for transmission via the one or more spare TSVs. In some embodiments, the testing may include testing utilizing BIST circuitry of the memory device.

In some embodiments, if one or more defective TSVs are identified 810, then operations are implemented to provide self-repair of the operation of the defective TSVs using the one or more spare TSVs 820.

In some embodiments (shown as Process A), the self-repair includes receiving the generated error correction bits that are transmitted via the spare TSVs 825. In some embodiments, corrected data for the defective TSVs is generated using error correction logic 830, where the corrected data is based upon the received data and error correction data. The memory device operation then proceeds using the corrected data 835, allowing commencement or continuation of normal operation of the memory device 815.

In some embodiments (shown as Process B), the self-repair includes identifying a spare TSV for each defective TSV 850, and setting a multiplexer (or other logic elements) to direct data intended for the defective TSV to the spare TSV 855. In some embodiments, a demultiplexer is set to direct data from the identified spare TSVs to the appropriate data connections for the one or more defective TSVs 860. The memory device operation then proceeds using the spare TSV data path 865, allowing commencement or continuation of normal operation of the memory device 815.

Figure 9:
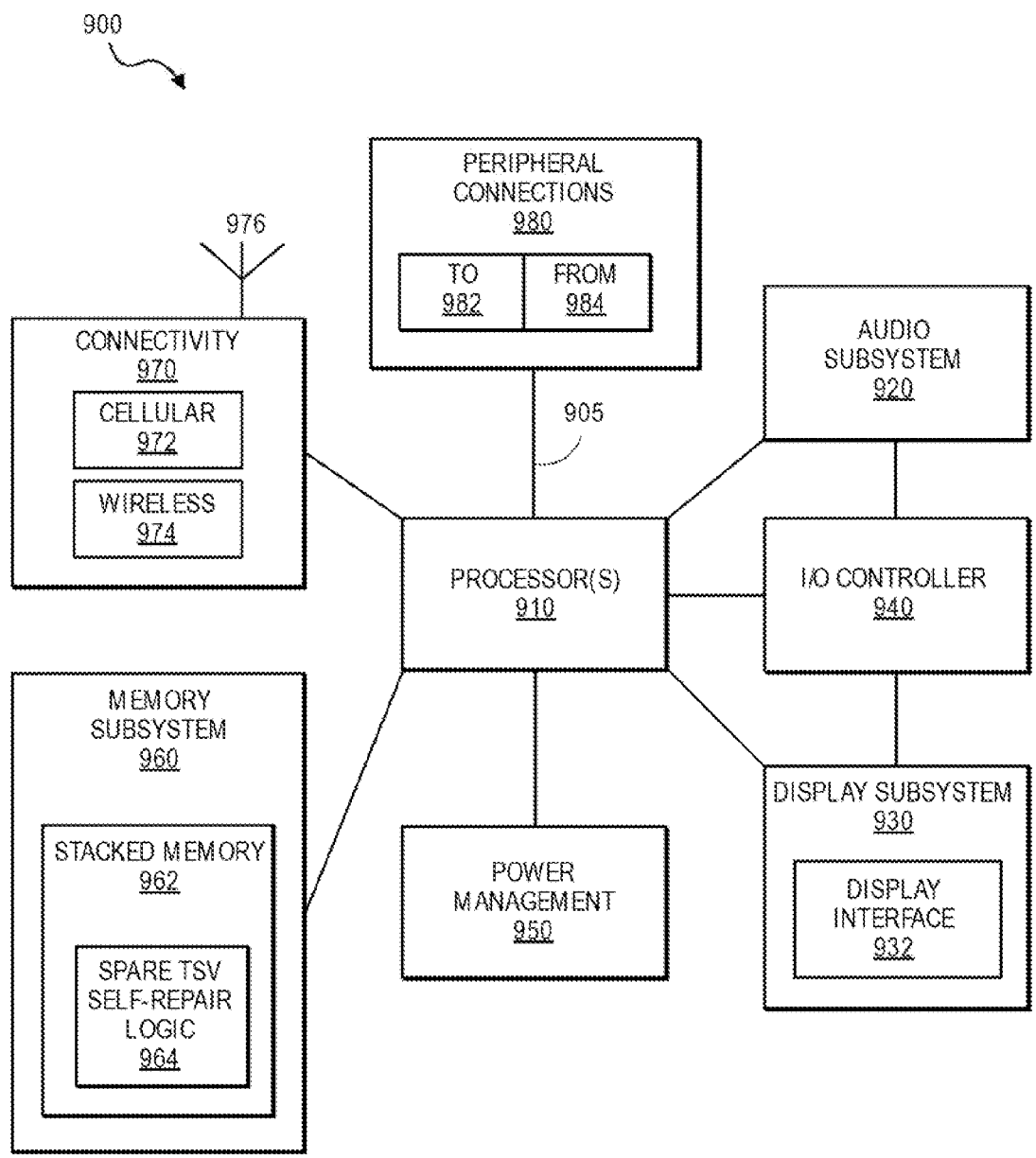
FIG. 9 is an illustration of an embodiment of an apparatus or system including elements for repair of operations of defective TSVs using spare TSVs.

FIG. 9 is an illustration of an embodiment of an apparatus or system including elements for repair of operations of defective TSVs using spare TSVs. Computing device 900 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 900. The components may be connected by one or more buses or other connections 905.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications, device functions, or both are executed. The processing operations include operations related to I/O (input/output) with a human user or with other devices, operations related to power management, operations, or both related to connecting device 900 to another device. The processing operations may also include operations related to audio I/O, display I/O, or both.

In one embodiment, device 900 includes audio subsystem 920, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 900, or connected to device 900. In one embodiment, a user interacts with device 900 by providing audio commands that are received and processed by processor 910.

Display subsystem 930 represents hardware (such as display devices) and software (such as drivers) components that provide a display having visual, tactile, or both elements for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touch screen device that provides both output and input to a user.

I/O controller 940 represents hardware devices and software components related to interaction with a user. I/O controller 940 can operate to manage hardware that is part of audio subsystem 920, a display subsystem 930, or both such subsystems. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 may interact with audio subsystem 920, display subsystem 930, or both such subsystems. For example, input through a microphone or other audio device can provide input or commands for one or more applications or functions of device 900. Additionally, audio output can be provided instead of or in addition to display output. In another example, if display subsystem includes a touch screen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, or other hardware that can be included in device 900. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation.

In some embodiments, memory subsystem 960 includes memory devices for storing information in device 900. The processor 910 may read and write data to elements of the memory subsystem 960. Memory can include nonvolatile (having a state that does not change if power to the memory device is interrupted), volatile (having a state that is indeterminate if power to the memory device is interrupted) memory devices, or both such memories. Memory 960 can store application data, user data, music, photos, documents, or other data, as well as system data (whether long-term or temporary) related to the execution of the applications and functions of system 900.

In some embodiments, the memory subsystem 960 may include a stacked memory device 962, where the stacked memory device includes one or more memory die layers and a system element. In some embodiments, the stacked memory device 962 include spare TSV self-repair logic 964, where the self-repair logic 964 provides for replacement of the operation of defective TSVs using the spare TSVs of the stacked memory device.

Connectivity 970 includes hardware devices (e.g., connectors and communication hardware for wireless communication, wired communication, or both) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 974 refers to wireless connectivity that is not cellular, and can include personal area networks (such as Bluetooth), local area networks (such as WiFi), wide area networks (such as WiMax), and other wireless communications. Connectivity may include one or more omnidirectional or directional antennas 976.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (such as downloading, uploading, changing, or synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 10:
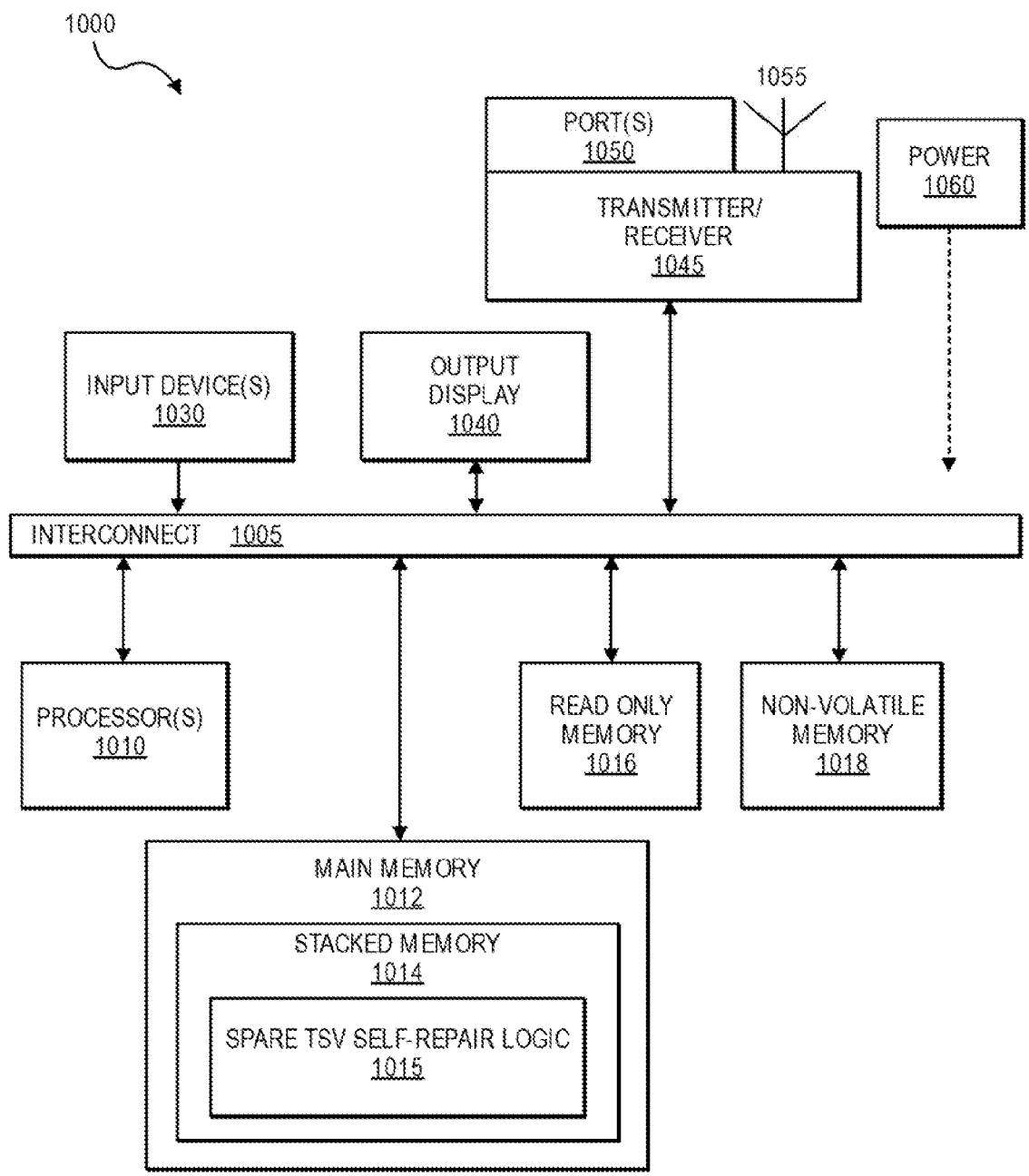
FIG. 10 illustrates an embodiment of a computing system including stacked memory having elements for repair of operations of defective TSVs using spare TSVs.

FIG. 10 illustrates an embodiment of a computing system including stacked memory having elements for repair of operations of defective TSVs using spare TSVs. The computing system may include a computer, server, game console, or other computing apparatus. In this illustration, certain standard and well-known components that are not germane to the present description are not shown. Under some embodiments, the computing system 1000 comprises an interconnect or crossbar 1005 or other communication means for transmission of data. The computing system 1000 may include a processing means such as one or more processors 1010 coupled with the interconnect 1005 for processing information. The processors 1010 may comprise one or more physical processors and one or more logical processors. The interconnect 1005 is illustrated as a single interconnect for simplicity, but may represent multiple different interconnects or buses and the component connections to such interconnects may vary. The interconnect 1005 shown in FIG. 10 is an abstraction that represents any one or more separate physical buses, point-to-point connections, or both connected by appropriate bridges, adapters, or controllers.

In some embodiments, the computing system 1000 further comprises a random access memory (RAM) or other dynamic storage device or element as a main memory 1012 for storing information and instructions to be executed by the processors 1010. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 1012 includes stacked memory 1014, wherein the stacked memory includes spare TSV self-repair logic 1015.

The computing system 1000 also may comprise a read only memory (ROM) 1016 or other static storage device for storing static information and instructions for the processors 1010. The computing system 1000 may include one or more non-volatile memory elements 1018 for the storage of certain elements.

In some embodiments, the computing system 1000 includes one or more input devices 1030, where the input devices include one or more of a keyboard, mouse, touch pad, voice command recognition, gesture recognition, or other device for providing an input to a computing system.

The computing system 1000 may also be coupled via the interconnect 1005 to an output display 1040. In some embodiments, the display 1040 may include a liquid crystal display (LCD) or any other display technology, for displaying information or content to a user. In some environments, the display 1040 may include a touch-screen that is also utilized as at least a part of an input device. In some environments, the display 1040 may be or may include an audio device, such as a speaker for providing audio information.

One or more transmitters or receivers 1045 may also be coupled to the interconnect 1005. In some embodiments, the computing system 1000 may include one or more ports 1050 for the reception or transmission of data. The computing system 1000 may further include one or more omnidirectional or directional antennas 1055 for the reception of data via radio signals.

The computing system 1000 may also comprise a power device or system 1060, which may comprise a power supply, a battery, a solar cell, a fuel cell, or other system or device for providing or generating power. The power provided by the power device or system 1060 may be distributed as required to elements of the computing system 1000.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. An apparatus comprising:
a stack comprising a plurality of memory dies, including a first memory die;
wherein the first memory die includes:
a plurality of interconnects, the plurality of interconnects including a plurality of data interconnects and one or more redundant interconnects, and
repair logic to map operation of a defective interconnect of the plurality of data interconnects to the one or more redundant interconnects, the repair logic to:

detect the defective interconnect,
map data intended for the defective interconnect to a first redundant interconnect of the first memory die, and
map data to be received on the first redundant interconnect to a connection for the defective interconnect.

2. The apparatus of claim 1, wherein the repair logic includes one or more elements to route data intended for the defective interconnect to the first redundant interconnect.

3. The apparatus of claim 2, wherein the repair logic includes one or more elements to route data received on the first redundant interconnect to a connection for the defective interconnect.

4. The apparatus of claim 1, wherein the repair logic is to provide for static repair of operation of defective interconnects in manufacture of the apparatus.

5. The apparatus of claim 1, wherein the repair logic is to provide for dynamic repair of operation of defective interconnects of the memory die in operation of the apparatus.

6. The apparatus of claim 5, wherein dynamic repair includes repair of defective interconnects of the first memory die in response to initialization testing for the apparatus.

7. The apparatus of claim 1, wherein each of the plurality of memory dies of the stack includes repair logic to map operation of a defective interconnect of the plurality of data interconnects to the one or more redundant interconnects of the respective memory die.

8. A system comprising:
a processor to process data of the system;
a transmitter, receiver, or both coupled with an omnidirectional antenna to transmit data, receive data, or both; and
a memory to store data, the memory including a stacked memory device, the stacked memory device including a stack comprising a plurality of memory dies, including a first memory die;
wherein the first memory die includes:
a plurality of interconnects, the plurality of interconnects including a plurality of data interconnects and one or more redundant interconnects, and
repair logic to map operation of a defective interconnect of the plurality of data interconnects to the one or more redundant interconnects, the repair logic of the first memory die to:
detect the defective interconnect,
map data intended for the defective interconnect to a first redundant interconnect, and
map data to be received on the first redundant interconnect to a connection for the defective interconnect.

9. The system of claim 8, wherein the repair logic includes one or more elements to route data intended for the defective interconnect to the first redundant interconnect.

10. The system of claim 9, wherein the repair logic includes one or more elements to route data received on the first redundant interconnect to a connection for the defective interconnect.

11. The system of claim 8, wherein the repair logic is to provide for static repair of operation of defective interconnects of the first memory die in manufacture of the memory device.

12. The system of claim 8, wherein the repair logic is to provide for dynamic repair of operation of defective interconnects of the first memory die in operation of the memory device.

13. The system of claim 12, wherein dynamic repair includes repair of defective interconnects of the first memory die in response to initialization testing for the system.

14. The system of claim 8, wherein the system comprises a mobile device.

15. The system of claim 14, wherein the mobile device comprises a tablet computer.

16. The system of claim 8, wherein each of the plurality of memory dies of the stack includes repair logic to map operation of a defective interconnect of the plurality of data interconnects to the one or more redundant interconnects of the respective memory die.

17. A method comprising:
conducting a test of a stacked memory device, the stacked memory device including a stack comprising a plurality of memory dies, including a first memory die, the first memory die including a plurality of interconnects, the plurality of interconnects including a plurality of data interconnects and one or more redundant interconnects, and including repair logic to map operation of defective interconnects of the plurality of data interconnects to the one or more redundant interconnects;
detecting a defective interconnect of the plurality of data interconnects of the first memory die; and
repairing operation of the defective interconnect with the repair logic of the first memory die, the repair of operation including:
mapping data intended for the defective interconnect to a first redundant interconnect, and
mapping data to be received on the first redundant interconnect to a connection for the defective interconnect.

18. The method of claim 17, wherein mapping data intended for the defective interconnect to a first redundant interconnect includes causing the repair logic to set one or more elements to route the data intended for the defective interconnect to the first redundant interconnect.

19. The method of claim 18, wherein mapping data received on the first redundant interconnect to a connection for the defective interconnect includes causing the repair logic to set one or more elements to route the data received on the first redundant interconnect to the connection for the defective interconnect.

20. The method of claim 17, wherein repairing operation of the defective interconnect includes static repair of defective interconnects of the first memory die in manufacture of the stacked memory device.

21. The method of claim 17, wherein repairing operation of the defective interconnect includes dynamic repair of operation of defective interconnects of the first memory die in operation of the stacked memory device.

22. The method of claim 21, wherein dynamic repair includes repair of defective interconnects of the first memory die in response to initialization testing for the stacked memory device.

23. At least one non-transitory computer-readable storage medium having stored thereon data representing sequences of instructions that, when executed by one or more processors, cause the one or more processor to perform operations comprising:
conducting a test of a stacked memory device, the stacked memory device including a stack comprising a plurality of memory dies, including a first memory die, the first memory die including a plurality of interconnects, the plurality of interconnects including a plurality of data interconnects and one or more redundant interconnects, and including repair logic to map operation of defective interconnects of the plurality of data interconnects to the one or more redundant interconnects;

detecting a defective interconnect of the plurality of data interconnects of the first memory die; and repairing operation of the defective interconnect with the repair logic of the first memory die, the repair of operation including:

mapping data intended for the defective interconnect to a first redundant interconnect, and mapping data to be received on the first redundant interconnect to a connection for the defective interconnect.

24. The medium of claim 23, wherein mapping data intended for the defective interconnect to the first redundant interconnect includes causing the repair logic to set one or more elements to route the data intended for the defective interconnect to the first redundant interconnect.

25. The medium of claim 24, wherein mapping data received on the first redundant interconnect to a connection for the defective interconnect includes causing the repair logic to set one or more elements to route the data received on the first redundant interconnect to the connection for the defective interconnect.

26. The medium of claim 23, wherein repairing operation of the defective interconnect includes static repair of defective interconnects of the first memory die in manufacture of the stacked memory device.

27. The medium of claim 23, wherein repairing operation of the defective interconnect includes dynamic repair of operation of defective interconnects of the first memory die in operation of the stacked memory device.

28. The medium of claim 27, wherein dynamic repair includes repair of defective interconnects of the first memory die in response to initialization testing for the stacked memory device.

* * * * *